(12) United States Patent
Sherrit et al.

(10) Patent No.: US 7,902,943 B2
(45) Date of Patent: Mar. 8, 2011

(54) WIRELESS ACOUSTIC-ELECTRIC FEED-THROUGH FOR POWER AND SIGNAL TRANSMISSION

(75) Inventors: Stewart Sherrit, La Crescenta, CA (US); Yoseph Bar-Cohen, Seal Beach, CA (US); Xiaoqi Bao, San Gabriel, CA (US); Benjamin Doty, Pasadena, CA (US); Mircea Badescu, Arcadia, CA (US); Zensheu Chang, Irvine, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/082,300

(22) Filed: Apr. 10, 2008

(65) Prior Publication Data

US 2008/0258841 A1 Oct. 23, 2008

Related U.S. Application Data

(60) Provisional application No. 60/926,001, filed on Apr. 23, 2007.

(51) Int. Cl.
*H03H 9/02* (2006.01)
*H01L 41/02* (2006.01)

(52) U.S. Cl. .................. 333/186; 333/195; 310/335
(58) Field of Classification Search .................. 333/133, 333/186, 193, 194, 195, 196, 201; 310/335
See application file for complete search history.

(56) References Cited

U.S. PATENT DOCUMENTS

| | | | | |
|---|---|---|---|---|
| 4,209,759 A | * | 6/1980 | Volluet | 333/153 |
| 5,361,077 A | * | 11/1994 | Weber | 343/846 |
| 7,057,478 B2 | * | 6/2006 | Korden et al. | 333/189 |
| 7,151,424 B2 | * | 12/2006 | Kando | 333/193 |
| 7,262,676 B2 | * | 8/2007 | Ruile et al. | 333/193 |
| 7,525,398 B2 | * | 4/2009 | Nishimura et al. | 333/189 |
| 7,653,152 B2 | * | 1/2010 | Al-Eidan | 375/334 |

* cited by examiner

*Primary Examiner* — Dean O Takaoka
(74) *Attorney, Agent, or Firm* — Milstein Zhang & Wu LLC; Joseph B. Milstein

(57) ABSTRACT

An embodiment provides electrical energy from a source on one side of a medium to a load on the other side of the medium, the embodiment including a first piezoelectric to generate acoustic energy in response to electrical energy from the source, and a second piezoelectric to convert the received acoustic energy to electrical energy used by the load. Other embodiments are described and claimed.

14 Claims, 8 Drawing Sheets

WIRELESS ACOUSTIC-ELECTRIC FEED-THROUGH FOR POWER AND SIGNAL TRANSMISSION

PRIORITY CLAIM

This application claims the benefit of U.S. Provisional Application No. 60/926,001, filed 23 Apr. 2007.

GOVERNMENT INTEREST

The invention claimed herein was made in the performance of work under a NASA contract, and is subject to the provisions of Public Law 96-517 (35 USC 202) in which the Contractor has elected to retain title.

BACKGROUND

Piezoelectric transducers may be used to transmit electrical energy through various acoustic mediums, such as for example a metal wall. Electrical energy is converted into acoustic energy which propagates through the medium, which is then converted back into electrical energy at the receiving side of the system. Applications may include charging batteries and devices that operate in sealed or closed containers, for example. It is desirable for electrical energy to be provided from source to destination in an efficient manner utilizing piezoelectric transducers, and to provide transducers which may easily couple to an acoustic medium.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
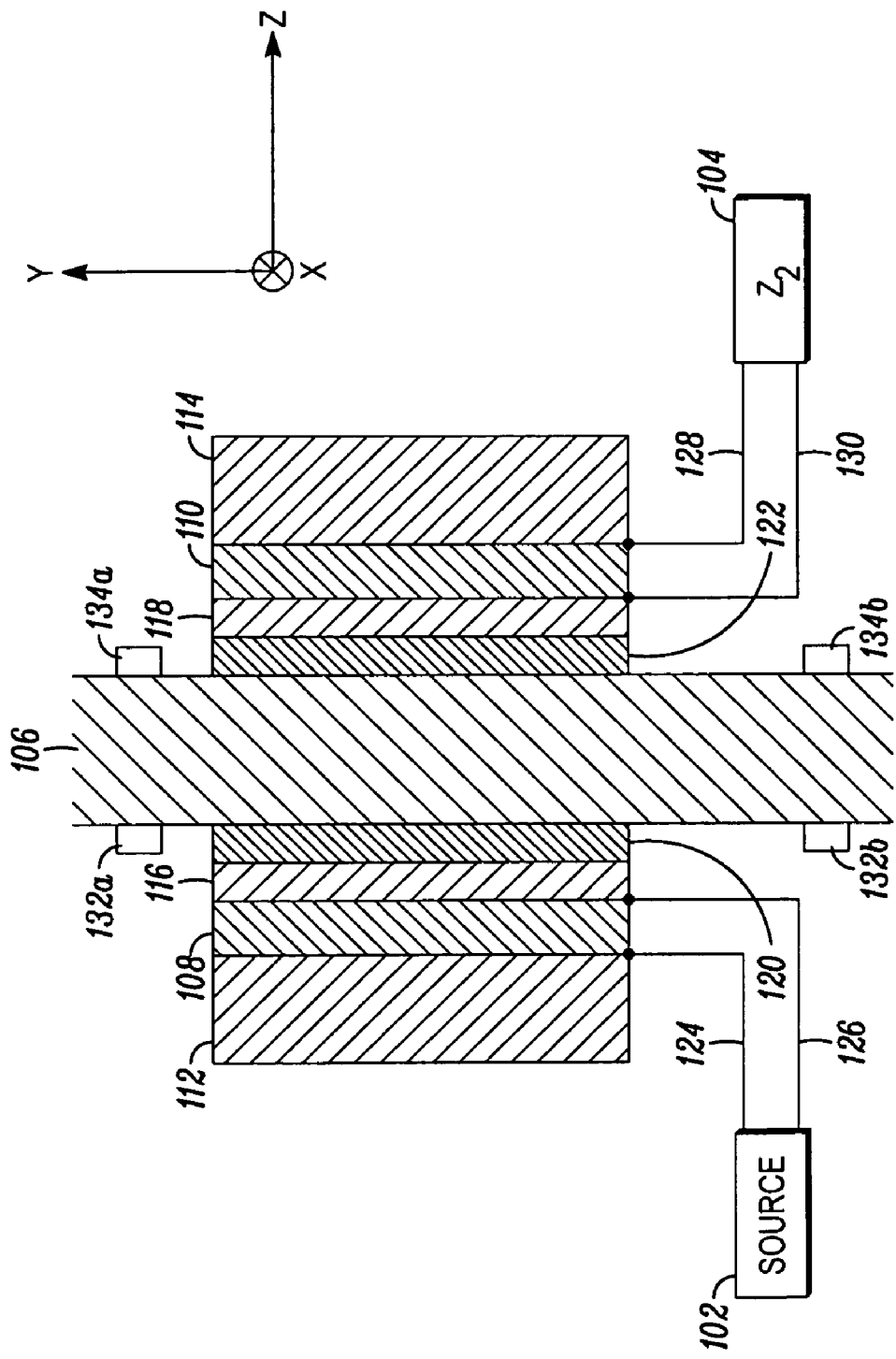
FIG. 1 illustrates transmission and reception of electrical energy by way of acoustic propagation in an acoustic medium according to an embodiment.

FIG. 1 illustrates an apparatus to transmit electrical energy from source 102 to load 104 by way of acoustic waves through medium 106 according to an embodiment. In some applications, medium 106 may be part of an enclosure encasing load 104. For example, medium 106 may be part of a metallic covering for a consumer electronic device, such as a cell phone, and load 104 may be a circuit for recharging a battery. As another example, medium 106 may be the covering of a personal computer, where load 104 may represent power circuits and electronics systems in the personal computer that are to be powered. In yet other applications, the electrical energy from source represents an information bearing signal, so that data may be provided from source 102 to load 104. The system Illustrated in FIG. 1 may be configured for two-way transmission of electrical energy, where load 104 may be switched out and replaced with a source, and source 102 may be switched out and replaced with a load.

Components 108 and 110 comprise piezoelectric material, such as for example PZT (lead zirconium titanate). Component 112 represents a backing or substrate material adjacent to one face of piezoelectric 108. Similarly, component 114 represents a backing or substrate material adjacent to one face of piezoelectric 110. Components 116 and 118 represent acoustic matching transformers. These transformers may be used if it is desired to match the acoustic impedance of the piezoelectric material to medium 106. Some embodiments may not include transformers 116 or 118.

Component 120 represents material by which the transmitter comprising components 108, 112, and 116 may be placed in acoustic contact with medium 106. Similarly, component 122 represents material by which the receiver comprising components 110, 114, and 118 may be placed in acoustic contact with medium 106.

For some embodiments, components 120 or 122 may represent bonding material by which the transmitter or receiver may be bonded to medium 106. For some embodiments, components 120 or 122 may represent other types of material by which the transmitter or receiver may be placed in acoustic contact with medium 106. For example, material 120 may be magnetic material bonded or attached to the transmitter, where medium 106 (or at least a part of medium 106) is also magnetic (e.g., paramagnetic or ferromagnetic), so that the transmitter is easily placed in acoustic contact with medium 106 by simply hand-placing the transmitter next to medium 106. For example, material 120 may be a magnet. Similar remarks also apply to component 122 and the receiver. Some embodiments may not include components 120 or 122.

In the above discussion, the components on the left-hand side of medium 106 were referred to as a transmitter, and the components on the right-hand side of medium 106 were referred to as a receiver. However, as discussed previously, the system illustrated in FIG. 1 may be used to transmit electrical energy in the other direction by switching in a source in place of load 104 and by switching in a load in place of source 102. Accordingly, use of the term transmitter in reference to the various components on the left-hand side of medium 106 is not meant to imply that these components may serve only as a transmitter, for they also may serve as a receiver. Similar remarks apply to the components on the right-hand side of medium 106. The terms transmitter and receiver are used merely for convenience, and later in this description, these components may be referred to as a transceiver to indicate their dual function as either a transmitter or a receiver.

In the diagram of FIG. 1, source 102 is connected to piezoelectric 108 by way of wires or electrical ports 124 and 126, and load 104 is connected to piezoelectric 110 by way of wires or electrical ports 128 and 130. As discussed above, source 102 may represent a source of electrical power to load 104, or as an information source for providing data to load 104. Accordingly, electrical ports 124 and 126, as well as electrical ports 128 and 130, may be suitable for providing or receiving electrical power or data signals, depending upon the application of the embodiment.

As is well known, piezoelectric materials generate an electric potential and response to mechanical stress. In operation, piezoelectric 108 expands and contracts (undergoes varying mechanical stresses) in response to electrical energy provided by source 102, which causes an acoustic wave to propagate through medium 106. This acoustic wave causes expansion and contraction (varying mechanical stresses) of piezoelectric 110. In turn, piezoelectric 110 generates a voltage at electrical ports 128 and 130 in response to its varying mechanical stresses. In this way, electrical energy may be viewed as being converted into acoustic energy, and then back again into electrical energy, so that electrical energy is effectively provided from source 102 to load 104.

For reference, an XYZ coordinate system is illustrated in FIG. 1, indicating that the positive x-axis points into the page of the drawing. In many applications, it is desirable for most of the acoustic energy to propagate in the z-axis direction The acoustic energy that travels in a direction radial to the z-axis (in an x-y plane) represents energy that may be lost. For example, Lamb waves are surface waves that propagate in a direction radial to the z-axis. Some embodiments include one or more components so as to provide a surface discontinuity on one or more faces of medium 106 to reflect the Lamb waves back to the transmitter or receiver. For example, a ring may be placed on medium 106 surrounding the transmitter to reflect surface waves back to the transmitter. As another example, a notch may be formed into medium 106, where the notch surrounds the transmitter so as to provide a surface discontinuity, resulting in reflection of the surface waves back to the transmitter. Similar remarks apply to the receive side of the embodiment of FIG. 1.

As a particular example, a reflector is represented in FIG. 1 by labels 132a and 132b, and another reflector is represented by labels 134a and 134b. Because much of the illustration in FIG. 1 represents a slice of an embodiment, where the slice is perpendicular to the x-axis direction (parallel to the y-z plane), it should be noted that for the embodiment of FIG. 1, labels 132a and 132b refer to a cross-sectional view or slice of a single surface wave reflector on the side of medium 106 facing the transmitter. Similarly, labels 134a and 134b refer to a cross-sectional view or slice of a single surface wave reflector on the side of medium 106 facing the receiver. Some embodiments may not include one or both of these surface wave reflectors.

Figure 2:
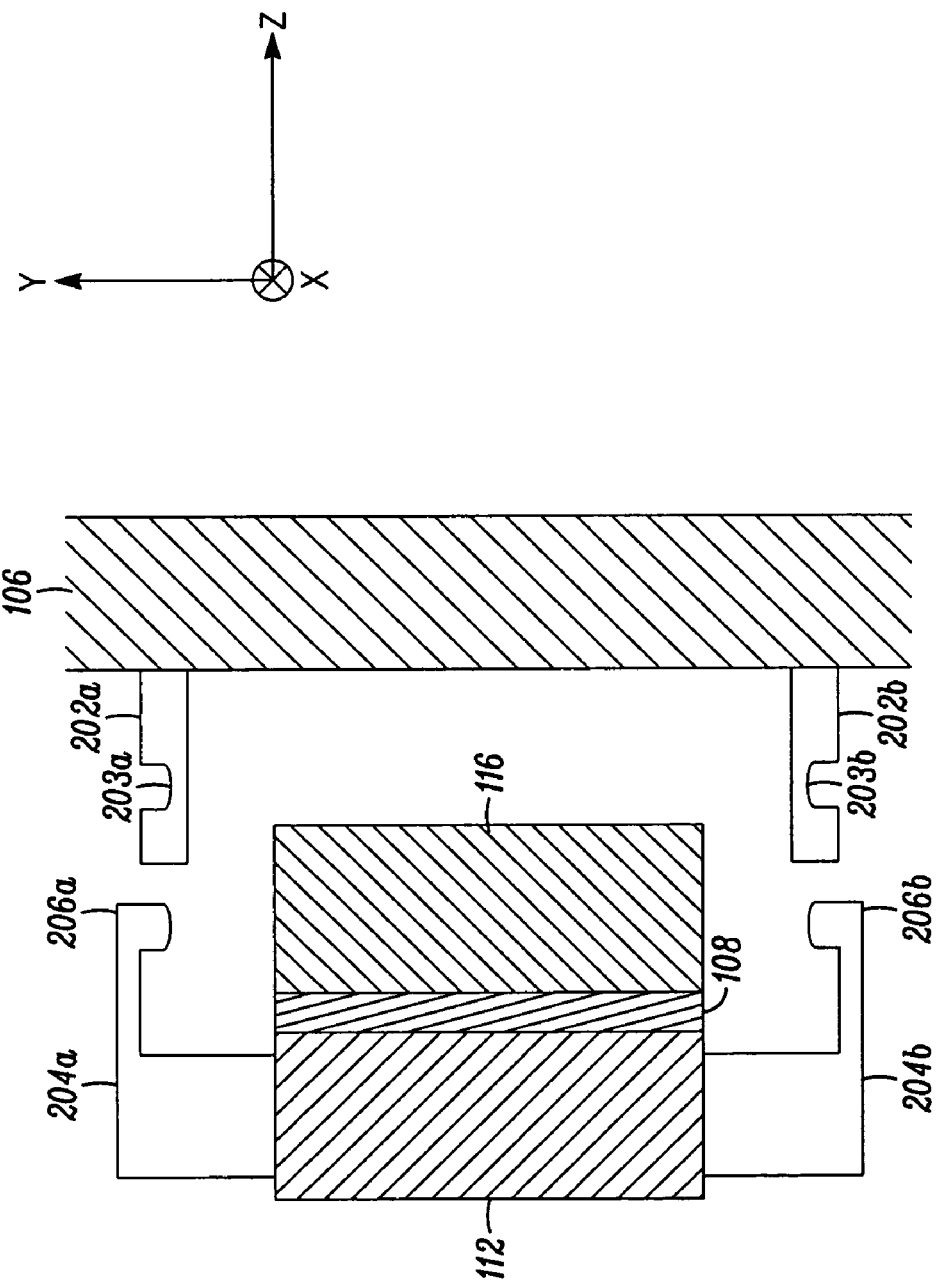
FIG. 2 illustrates coupling of a transmitter or receiver component to an acoustic medium according to an embodiment.

Some embodiments may place the transmitter or receiver into acoustic contact with medium 106 by way of mechanical fasteners. FIG. 2 represents a particular embodiment in which the fastener on a transmitter mechanically couples to a surface wave reflector. For ease of illustration, FIG. 2 illustrates only a single transmitter (or receiver), where components in FIG. 2 are labeled with the same numerals as their corresponding components in FIG. 1. In FIG. 2, numerals 202a and 202b are cross-sectional slices of a surface wave reflector formed on acoustic medium 106. One may imagine that this surface wave reflector is cylindrical in form, with a notch formed into the surface wave reflector as indicated by labels 203a and 203b. Numerals 204a and 204b label a cross-sectional slice of a mechanical mating structure formed on backing 112. This structure is formed to fit into the notch indicated by labels 203a and 203b, so that the transmitter (or receiver) is securely held in place next to medium 106 with acoustic transformer 116 in contact with medium 106. The structure indicated by labels 204a and 204b may comprise a flexible material so that a tab indicated by labels 206a and 206b fits into the notch (203a and 203b) as the structure is pushed onto and over the surface wave reflector. An embodiment such as FIG. 2 may be of use in which medium 106 is not sufficiently magnetic to allow the use of magnetic material as a way to attach the transmitter (or receiver) to medium 106.

Figure 3A:
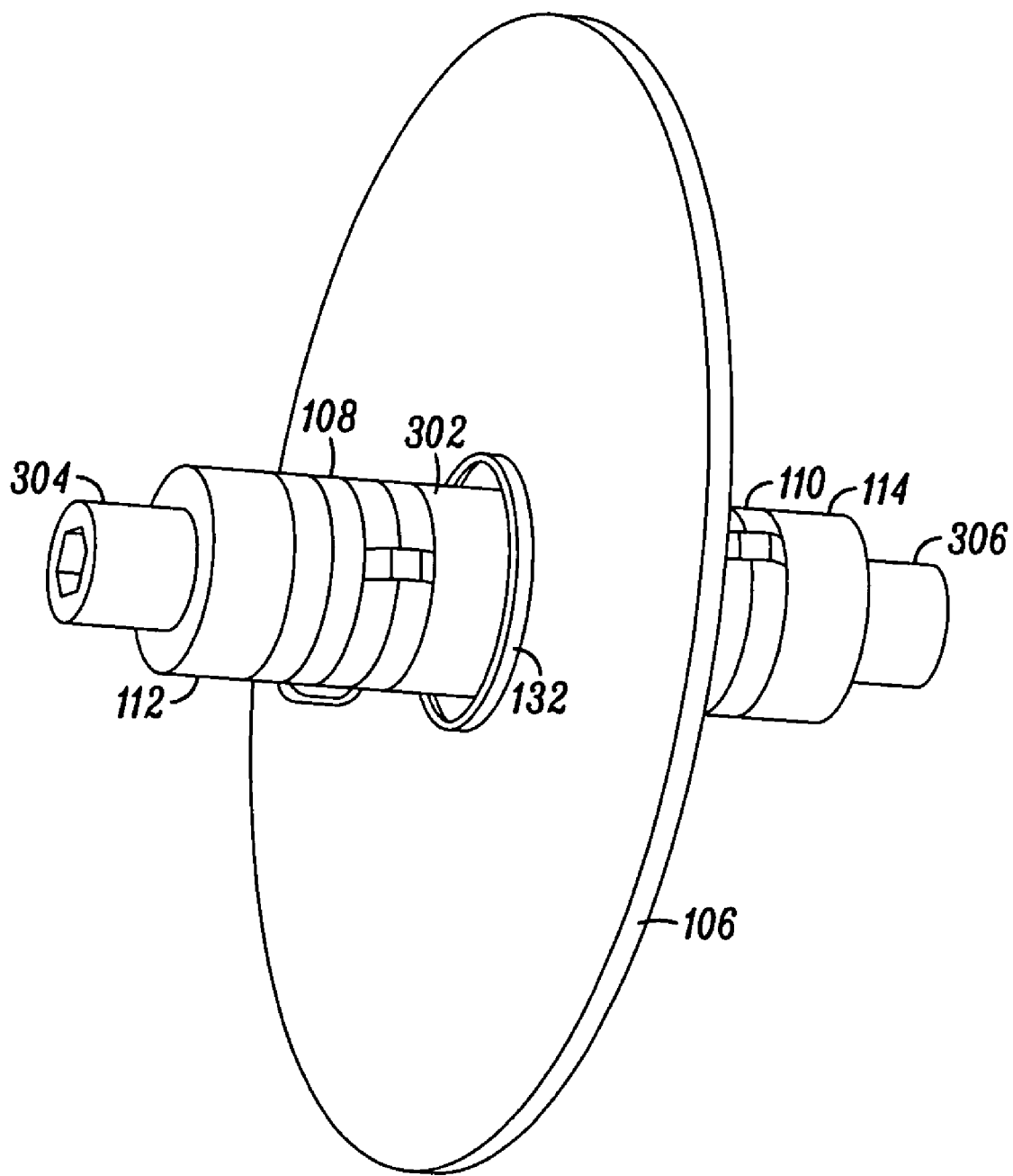
FIGS. 3a and 3b illustrate a perspective view of an embodiment.
Figure 3B:
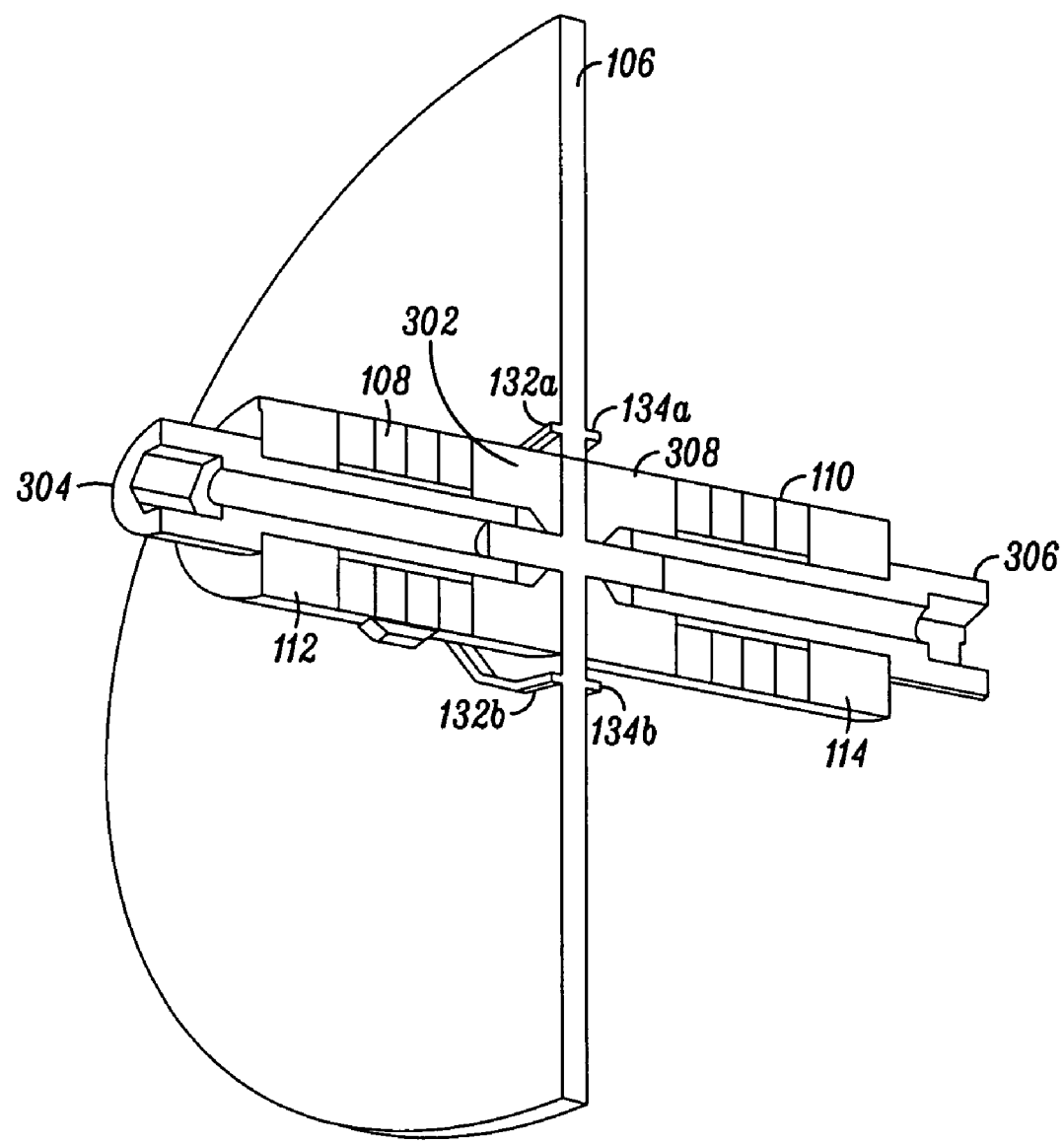

In some applications, particularly high-power applications, some embodiments pre-stress the piezoelectric material, which for some embodiments is found to reduce drive impedance so as to increase power delivery efficiency. Furthermore, pre-stressing the piezoelectric material may also help keep the piezoelectric material under compression so as to avoid fracture during high power activation. FIGS. 3A and 3B illustrate a perspective view of an embodiment in which the piezoelectric material for the transmitter and receiver are pre-stressed, where components in FIGS. 3A and 3B are labeled with the same numerals as their corresponding components in the previous figures.

In FIG. 3A, label 132 referrers to a surface wave reflector connected to medium 106. FIG. 3B illustrates a cut-away view of FIG. 3A. Component 302 is formed on a surface of medium 106 so that bolt 304 screws into component 302 to pre-stress piezoelectric material 108. Similarly, component 308 is formed on a second surface of medium 106 so that bolt 306 screws into component 308 to pre-stress piezoelectric material 110. An embodiment similar to FIGS. 3A and 3B may also include one or more an acoustic transformers.

The efficiency of providing electrical power to load 104 depends on the frequency of the electrical signal provided by source 102. It is expected that many embodiments may be modeled by a transfer function relating the output signal at output ports 128 and 130 to the input signal at input ports 124 and 126. Although the use of a transfer function may imply that the system response of an embodiment may be modeled as linear and time invariant, this is only an approximation, and some embodiments may exhibit nonlinearities as well as time-varying system parameters.

Figure 4:
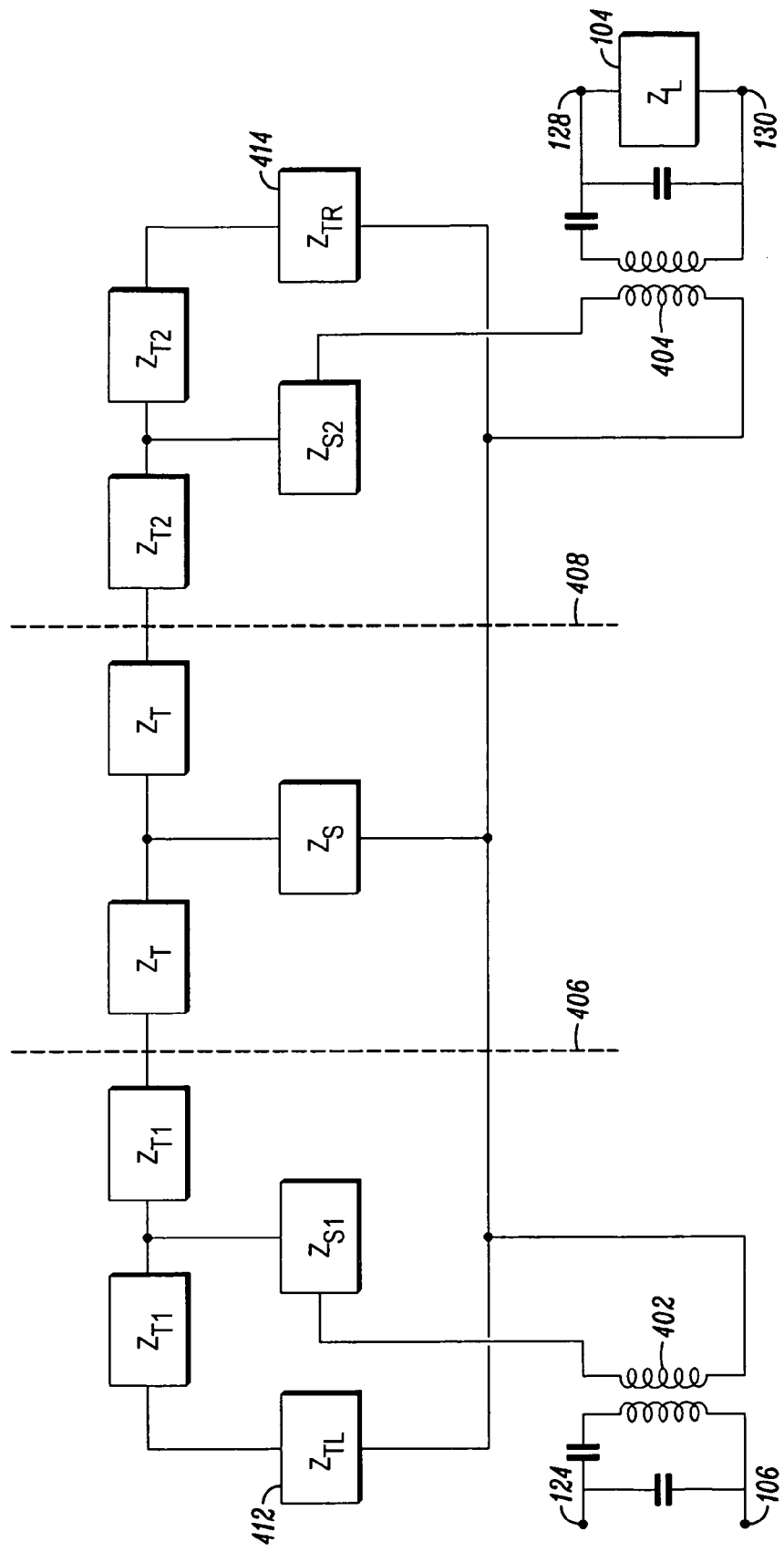
FIG. 4 illustrates an electrical network circuit model of an embodiment.

FIG. 4 illustrates a network circuit model for some embodiments, where a source provides the input signal at input ports 124 in 106, and an output signal at output ports 128 and 130 is provided to load 104. The voltages and currents in the network circuit model of FIG. 4 from secondary winding 402 to primary winding 404 model the forces and velocities, respectively, in the electric-acoustic system comprising backing layers, piezoelectric materials, the medium, and other mechanical structures by which the transmitter or receiver may be attached or coupled to the medium. The circuit elements in between lines 406 and 408 in FIG. 4 model medium 106. Circuit elements 412 models backing layer 112 in FIG. 1, and circuit element 414 models backing layer 114 in FIG. 1. If these backing layers are not present in an embodiment, then their corresponding impedance values are set to zero.

Figure 5:
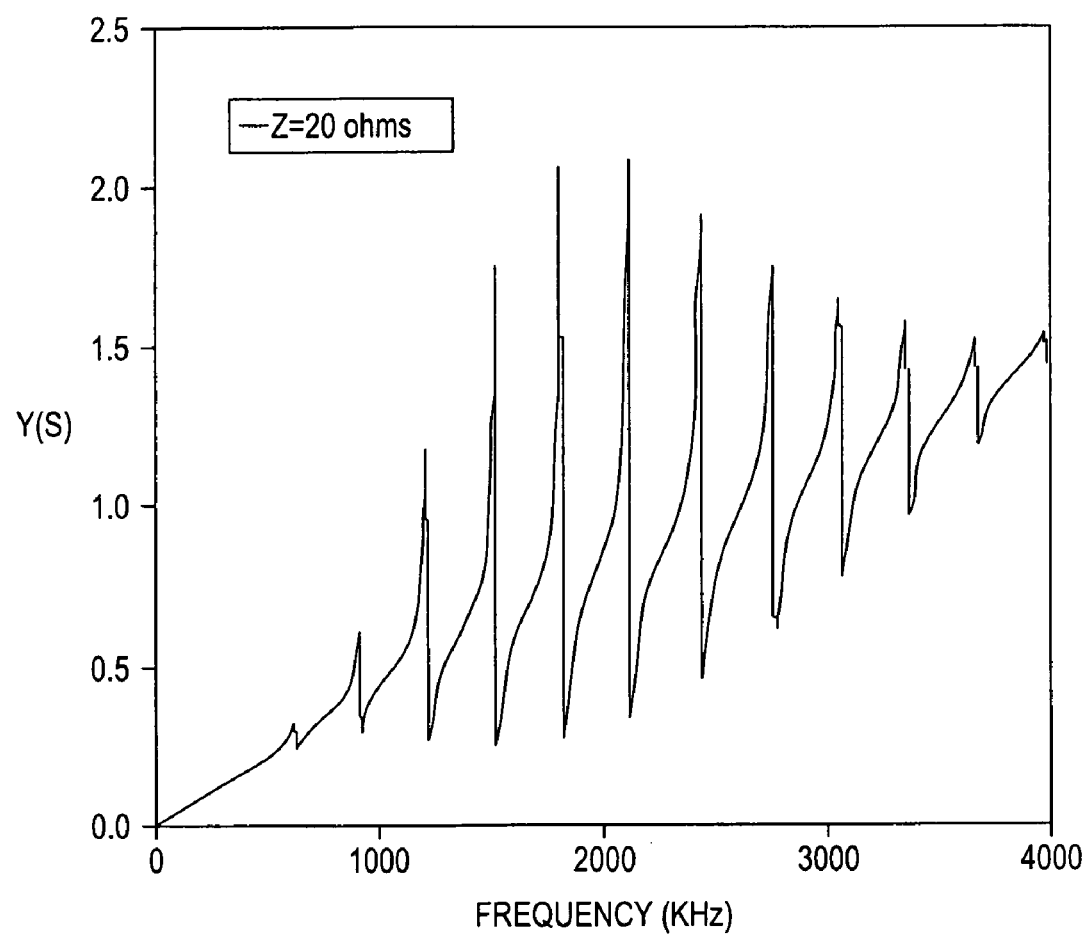
FIG. 5 illustrates resonant frequencies of the admittance function of an embodiment.

Some are all of the circuit impedances denoted in FIG. 4 may represent frequency dependent impedances. For many embodiments, it is found that the input admittance exhibits resonances. This also results in the power inefficiency exhibiting resonances in the frequency domain. FIG. 5 illustrates system admittance (actually, the magnitude of the admittance) as a function of frequency for an embodiment, where the load is modeled as having a real-valued impedance of 20Ω. Note the peaks in the admittance function in FIG. 5 at various frequencies, denoting resonances of the system transfer function.

Figure 6:
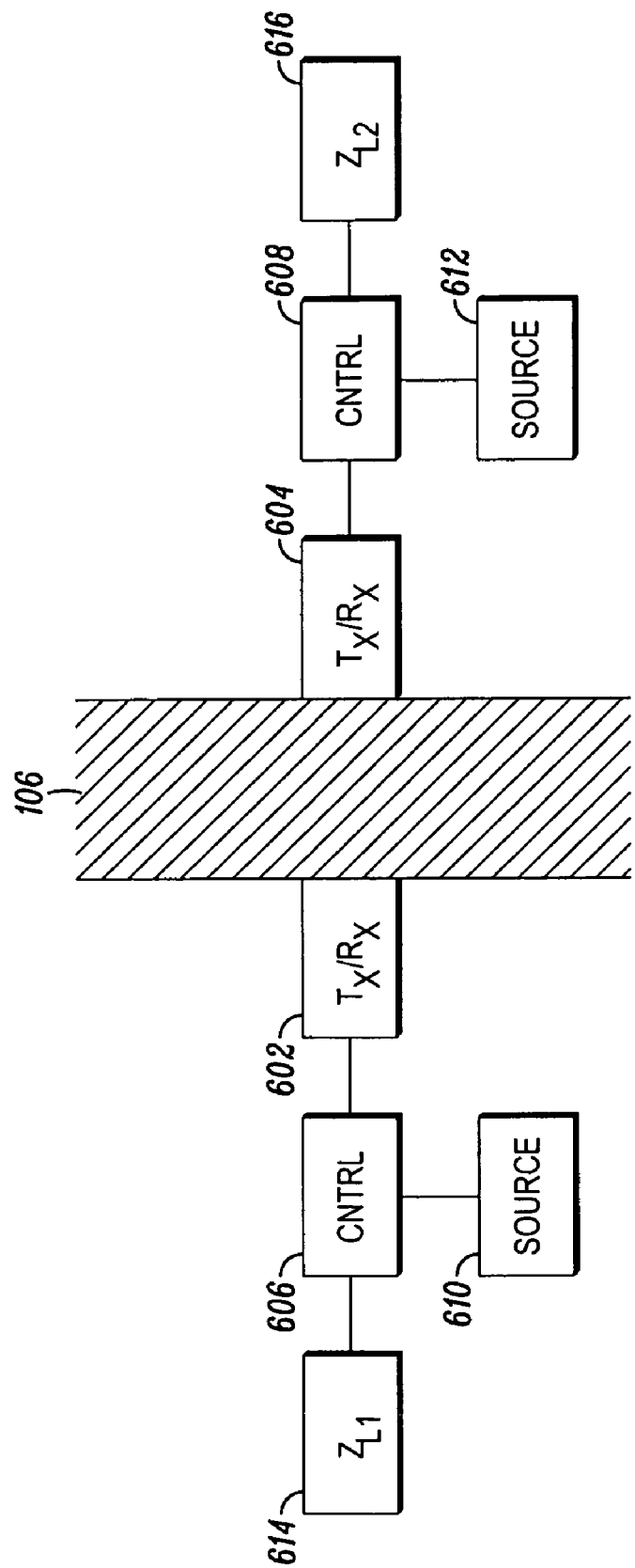
FIG. 6 illustrates electrical power transmission and reception, and data transmission and reception, according to an embodiment.

Some embodiments utilize the system resonances for the transmission and reception of electrical power and information signals. FIG. 6 illustrates at the system level an embodiment for transmitting and receiving electrical power or information signals. Transceiver modules 602 and 604 include various piezoelectric layers and other layers, such as for example acoustic transformers and bonding material, as described with respect to FIG. 1, but for simplicity such sub-components are not explicitly illustrated in FIG. 6. Controls circuits 606 and 608 allow for the transmission and reception of electrical power, data information, or both. Sources 610 and 612 represent components that provide data that is to be transmitted. Loads 614 and 616 represent components that receive data signals or receive electrical power.

As a particular example, the components on the right-hand side of medium 106 in FIG. 6 may represent a consumer electronic device that includes a rechargeable battery, as well as a memory module for storing firmware or data that is used or generated by the device; and the components on the left-hand side of medium 106 may represent a smart charging and data exchange circuit to charge the battery and to send or receive data to or from the electronic device. For this particular example, component 616 is a power circuit to provide direct current charging of a rechargeable battery. During charging, control circuit 608 couples the output of transceiver 604 to power circuit 616 so that the AC (alternating current) electrical power generated by transceiver 604 in response to the acoustic wave generated by transceiver 602 is provided to power circuit 616. Within this context, source 610 provides the electrical energy that is used to recharge the battery, where control circuit 606 couples source 610 to transceiver 602 so that electrical energy is converted into acoustic energy. To increase power efficiency, the power may be concentrated among one or more frequencies exhibiting high resonance.

Continuing with this particular example of a consumer electronic device, there may be instances in which data is to be transmitted from the electronic device to the smart charging and data exchange circuit on the left-hand side of medium 106. In this particular example of a data transfer mode, control circuit 608 de-couples power circuit 616 from the output of transceiver 604, and couples source 612 to transceiver 604. Source 612 provides an information signal to transceiver 604. In this data transfer mode, control circuit 606 decouples source 610 from transceiver 602, and couples component 614 to the output of transceiver 602. Within this context, component 614 may represent a receive circuit for receiving the information signal provided by source 612.

The transmission of data may take advantage of the various resonant frequencies of the system as illustrated in the admittance plot of FIG. 5. Of course, data transmission may also flow from a smart charging and data exchange circuit on the left-hand side of medium 106 to the device on the right-hand side of medium 106, where now source 610 is the source of the information signal transmitted across medium 106 by way of acoustic vibrations, and load 616 is the receiver of the information signal. As when the data information flow is from the right-hand side of medium 106 to the left-hand side of medium 106, the communication of data from the left-hand side to the right-hand side of medium 106 may take advantage of the resonant frequencies of the system.

Figure 7:
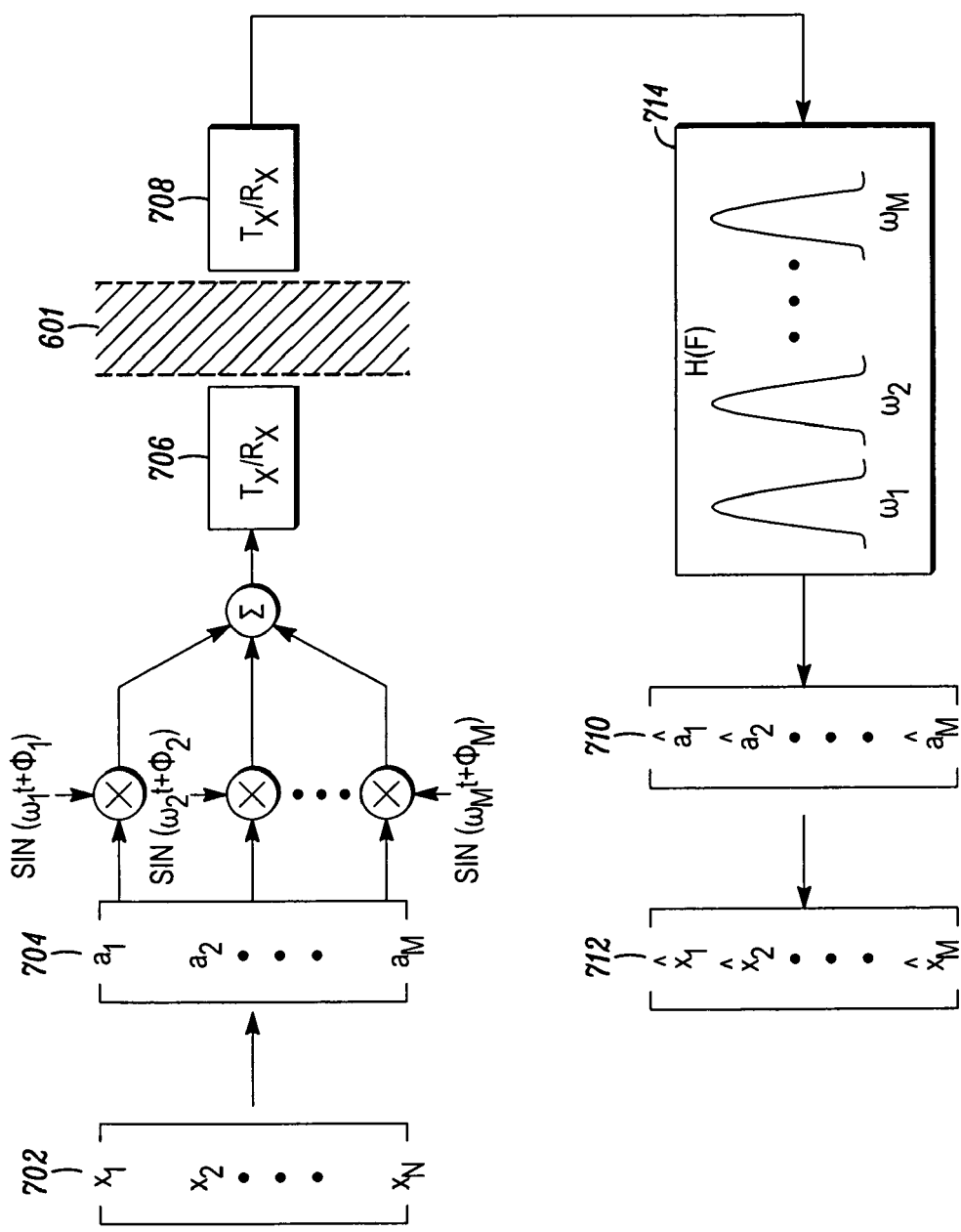
FIG. 7 illustrates a signal processing flow according to an embodiment.

The signal processing flow for the above described embodiment may be illustrated as shown in FIG. 7, where for simplicity only one-way communication is illustrated, but where of course the communication channel may be operated in both directions. In FIG. 7, a block of digital data 702 to be transmitted may be represented by a vector $[x_1, x_2, \ldots x_N]$ of N digital data symbols $x_i$, which may be taken as binary digits for many practical applications. Suppose there are M resonant frequencies (or harmonics) $\{\omega_1, \omega_2, \ldots, \omega_M\}$ over which data is to be transmitted. Source 610 (or 612) provides a mapping from this block of digital data to a block of channel symbols $[a_1, a_2, \ldots a_M]$ (704) indicated in FIG. 7, where each channel symbol $a_i$ Modulates the resonant frequency (or harmonic) sinusoid $\sin(\omega_i t + \phi_i)$ (where $\phi_i$ is some phase). This modulation may be viewed as being performed by a source 610 (or 612) to provide the signal $$\sum_{i=1}^{M} a_i \sin(\omega_i + \phi_i)$$

as the drive signal to transceiver 706. As a particular example, each channel symbol $a_i$ may be either 0 or some constant amplitude A, depending upon the block of data symbols. But for some embodiments, the channel symbols may be chosen from a larger set of amplitudes. As another particular example, an embodiment may have an equal number of channel symbols and data symbols where N=M, so that the encoding scheme may be relatively simple in the sense that a binary digit is mapped into either 0 or the constant amplitude A. In practice, there may be an intermediate step whereby a block of data symbols is first mapped into a block of code symbols before mapping into a block of channel symbols, but the overall mapping may still be viewed as a mapping from data symbols into channel symbols.

The electrical drive signal is converted into acoustic energy propagated through medium 106, whereupon it is converted back into an electrical signal by transceiver 708. Receiver module 616 (or 614) may be viewed as performing demodulation to provide the received vector of channel symbols $[\hat{a}_1, \hat{a}_2, \ldots \hat{a}_M]$, and performing decoding to provide the received data vector $[\hat{x}_1, \hat{x}_2, \ldots \hat{x}_N]$, where $\hat{a}_i$ is an estimate of the channel symbol $a_i$, and $\hat{x}_i$ is an estimate of the data symbol $x_i$. For the embodiment in FIG. 7, a set of bandpass filters 714, each tuned to one of the resonant frequencies, provides channel symbol estimates $[\hat{a}_1, \hat{a}_2, \ldots \hat{a}_M]$ (710), and a decoding algorithm is used to provide data estimates $[\hat{x}_1, \hat{x}_2, \ldots \hat{x}_N]$ (712).

The above-described embodiment is merely one example of a signal processing system. More generally, the various resonant harmonics may be viewed as providing a signal constellation space, where during transmission the data symbols are mapped into a transmitted signal in the signal constellation space, and the receiver estimates the data symbols based upon the received electrical signal. Furthermore, the encoding of data symbols may employ convolutional codes instead of block codes, and for some embodiments the coding may be nonlinear. Generally, any signal processing communication scheme may be employed that is suited to a signal constellation space based upon the various system resonant frequencies (harmonics).

The data that is transmitted or received may represent software, firmware, or data indicative of measurements or system parameters, for example. Various communication protocols may be used for the exchange of data, as well as for the delivery of electrical power. For the example of recharging a battery in a consumer electronic device, there first may be an exchange of data to provide information to the smart charging and data exchange circuit about the battery condition, and the charging may be interrupted at various predetermined times to exchange data as to the current charge level of the battery so that there is proper charging of the battery.

Various changes and modifications may be made to the disclosed embodiments without departing from the scope of the invention as claimed below.

What is claimed is:
1. An apparatus comprising:
    a medium;
    a piezoelectric acoustically coupled to the medium;
    a reflector in contact with the medium to reflect Lamb waves toward the piezoelectric; and an acoustic transformer coupled to the piezoelectric and acoustically coupled to the medium, so that the acoustic transformer is positioned in between the piezoelectric and the medium.

2. The apparatus as set forth in claim 1, wherein the reflector is formed on the medium and about the acoustic transformer.

3. An apparatus comprising:
a medium;
a piezoelectric acoustically coupled to the medium; and
a reflector in contact with the medium to reflect Lamb waves toward the piezoelectric;
the apparatus having a set of resonant frequencies, the apparatus further comprising:
a source to modulate the piezoelectric at one or more frequencies belonging to the set of resonant frequencies.

4. An apparatus comprising:
a medium;
a reflector in contact with the medium to reflect Lamb waves propagating in the medium;
a piezoelectric;
a coupling structure coupled to the piezoelectric, where the coupling structure is coupled to the reflector to acoustically couple the piezoelectric to the medium; and
an acoustic transformer coupled to the piezoelectric and acoustically coupled to the medium, so that the acoustic transformer is positioned in between the piezoelectric and the medium.

5. The apparatus as set forth in claim 4, the apparatus having a set of resonant frequencies, the apparatus further comprising:
a source to modulate the piezoelectric at one or more frequencies belonging to the set of resonant frequencies.

6. An apparatus comprising:
a medium having a first side and a second side;
a first piezoelectric proximal to the first side of the medium;
a second piezoelectric proximal to the second side of the medium; and
a magnet coupled to the first piezoelectric so that the first piezoelectric may be acoustically coupled to the medium by placing the magnet on the medium.

7. The apparatus as set forth in claim 6, further comprising:
an acoustic transformer coupled to the first piezoelectric and coupled to the magnet.

8. The apparatus as set forth in claim 6, further comprising:
a reflector in contact with the medium to reflect Lamb waves propagating in the medium.

9. The apparatus as set forth in claim 6, the apparatus having a set of resonant frequencies, the apparatus further comprising:
a source to modulate the first piezoelectric at one or more frequencies belonging to the set of resonant frequencies.

10. The apparatus as set forth in claim 6, the apparatus having a set of resonant frequencies, the apparatus further comprising:
a set of bandpass filters, each bandpass filter tuned to a frequency belonging to the set of resonant frequencies.

11. An apparatus comprising:
a medium having a first side and a second side;
a first piezoelectric acoustically coupled to the first side of the medium;
a second piezoelectric, where the first piezoelectric and the second piezoelectric when acoustically coupled to the first and second sides of the medium, respectively, provide a transfer function for an input electrical signal applied to the second piezoelectric and an output electrical signal generated by the first piezoelectric, the transfer function having a set of resonant frequencies;
a set of bandpass filters coupled to the first piezoelectric, each bandpass filter tuned to a frequency belonging to the set of resonant frequencies;
a source coupled to the second piezoelectric to modulate the second piezoelectric at one or more frequencies belonging to the set of resonant frequencies; and
a surface wave reflector in contact with the first side of the medium to reflect surface waves.

12. An apparatus comprising:
a medium having a first side and a second side;
a first piezoelectric acoustically coupled to the first side of the medium;
a second piezoelectric, where the first piezoelectric and the second piezoelectric when acoustically coupled to the first and second sides of the medium, respectively, provide a transfer function for an input electrical signal applied to the second piezoelectric and an output electrical signal generated by the first piezoelectric, the transfer function having a set of resonant frequencies;
a set of bandpass filters coupled to the first piezoelectric, each bandpass filter tuned to a frequency belonging to the set of resonant frequencies;
a source coupled to the second piezoelectric to modulate the second piezoelectric at one or more frequencies belonging to the set of resonant frequencies; and
an acoustic transformer coupled to the first piezoelectric so that the acoustic transformer is in between the first piezoelectric and the first side of the medium.

13. An apparatus comprising:
a medium having a first side and a second side;
a first piezoelectric acoustically coupled to the first side of the medium;
a second piezoelectric, where the first piezoelectric and the second piezoelectric when acoustically coupled to the first and second sides of the medium, respectively, provide a transfer function for an input electrical signal applied to the second piezoelectric and an output electrical signal generated by the first piezoelectric, the transfer function having a set of resonant frequencies;
a set of bandpass filters coupled to the first piezoelectric, each bandpass filter tuned to a frequency belonging to the set of resonant frequencies; and
a magnet coupled to the second piezoelectric to acoustically couple the second piezoelectric to the second side of the medium.

14. An apparatus comprising:
a medium having a first side and a second side;
a first piezoelectric acoustically coupled to the first side of the medium;
a second piezoelectric, where the first piezoelectric and the second piezoelectric when acoustically coupled to the first and second sides of the medium, respectively, provide a transfer function for an input electrical signal applied to the second piezoelectric and an output electrical signal generated by the first piezoelectric, the transfer function having a set of resonant frequencies;
a set of bandpass filters coupled to the first piezoelectric, each bandpass filter tuned to a frequency belonging to the set of resonant frequencies; and
a surface wave reflector in contact with the second side of the medium to reflect surface waves.

* * * * *